(12) United States Patent
Morche

(10) Patent No.: US 7,555,273 B2
(45) Date of Patent: Jun. 30, 2009

(54) BANDPASS FILTER WITH CARRIER FREQUENCY REDUCTION

(75) Inventor: Dominique Morche, Meylan (FR)

(73) Assignee: Fahrenheit Thermoscope LLC, Las Vegas, NV (US)

( * ) Notice: Subject to any disclaimer, the term of this patent is extended or adjusted under 35 U.S.C. 154(b) by 460 days.

(21) Appl. No.: 11/330,275

(22) Filed: Jan. 11, 2006

(65) Prior Publication Data

US 2006/0270379 A1 Nov. 30, 2006

Related U.S. Application Data

(63) Continuation of application No. 09/980,027, filed as application No. PCT/FR00/01448 on May 26, 2000, now Pat. No. 7,079,823.

(51) Int. Cl.
*H04B 1/16* (2006.01)

(52) U.S. Cl. .................. 455/209; 455/256; 455/264

(58) Field of Classification Search .................. 455/209
See application file for complete search history.

(56) References Cited

U.S. PATENT DOCUMENTS

| | | | |
|---|---|---|---|
| 4,653,117 A * | 3/1987 | Heck ........................... | 455/209 |
| 4,710,975 A | 12/1987 | Okamoto et al. | |
| 5,109,545 A | 4/1992 | Schiller et al. | |
| 7,079,823 B1 * | 7/2006 | Morche ........................ | 455/209 |

FOREIGN PATENT DOCUMENTS

| | | |
|---|---|---|
| EP | 0743749 | 11/1996 |
| GB | 2052196 | 1/1998 |
| WO | WO94/29948 | 12/1994 |

OTHER PUBLICATIONS

D. Morch, et al., "A High Q 200 MHz Low-Power Fully Integrated Bandpass IF Filter",IEEE1998 Custom Integrated Circuits Conference, 2 pages.

Christopher Nilson, et al., "Demande De Brevet", Depossee En France, May 17, 1995, Serial No. 95 05847.

International Search Report for PCT/FR00/01448: English translation attached, 6 pp., Dec. 7, 2000.

* cited by examiner

*Primary Examiner*—Yuwen Pan
*Assistant Examiner*—Ajibola Akinyemi

(57) ABSTRACT

A bandpass filtering method in which two frequency transpositions are performed in parallel on an input signal (SE) for filtering using respective first and second upstream mixing signals (SM1, SM2). A common oscillator (LO) is used which is coupled with a first phase shifter (MTM) to produce upstream mixing signals and which is coupled with a second phase shifter (MTV) to produce downstream mixing signals. Phase shifters are used in opposite manner on first and second signals so that each of said first and second signals (VT1, VT2) receives the phase-advanced output signal from one of the two phase shifters and the phase-delayed output signal from the other of the two phase shifters.

21 Claims, 2 Drawing Sheets

Etat de la technique

Etat de la technique

BANDPASS FILTER WITH CARRIER FREQUENCY REDUCTION

This application is a continuation of U.S. patent application Ser. No. 09/980,027, entitled "BAND-PASS FILTER WITH CARRIER FREQUENCY REDUCTION", filed Feb. 27, 2002, now U.S. Pat. No. 7,079,823 which claims priority to French Patent Application No. FR 99/06710 filed May 27, 1999 and PCT Application No. PCT/FR00/01448 filed May 26, 2000.

The invention relates to analog bandpass filters, and more particularly to those which present high selectivity at high frequencies, typically several hundreds of megahertz (MHz).

The invention thus relates in particular to front end architectures for receivers or transmitters of radio frequency (RF) signals.

One of the applications of the invention lies in integrating an analog portion of a GSM type mobile terminal receiver, where the purpose of the analog portion is to amplify the signal received by the antennas at a very high frequency, so as to select a frequency band of interest to the user of the terminal, and so as to reduce this frequency band to a low frequency.

In conventional manner, a frequency band is selected by filtering. The usual integrated filtering does not enable very high quality (Q) factors to be obtained. In order to select a narrow band corresponding to the frequency band of a user, it is therefore generally necessary either to use an external filter known as a surface acoustic wave (SAW) filter or to decrease the carrier frequency of the signal.

Such an operation of decreasing the carrier frequency, known as frequency transposition, is generally performed by means of analog multipliers. One of the major problems with such frequency transposition lies in the formation of an image frequency in addition to the desired signal. That is why known devices do not make it simple to decrease frequency without using an external filter (in particular a SAW filter) which serves to eliminate the image frequency.

To make a narrow filter for a channel situated at high frequency, French patent application FR 95/05847 proposes a circuit such as that shown in FIG. 1 in which the same input signal for filtering is subjected to a frequency transposition on each of two parallel branches, followed by lowpass filtering and followed by further frequency transposition to the original frequency of the input signal. In order to prevent the image frequency from being folded into the working channel, the four transpositions that are performed make use of only two signals which are in phase quadrature, and each of these two signals is applied to each of the two branches in a cross-over configuration enabling any phase shift differences to be compensated.

That document also proposes using an RC-CR phase shifter of the kind shown in FIG. 2, which guarantees that the two signals are in quadrature. Nevertheless, when the frequency of an oscillator placed at the input of the phase shifter is slightly different from the cutoff frequency of the phase shifter, then the two output signals are not equal in amplitude.

That phenomenon is compensated in the prior art device by crossing over the quadrature signals within the circuit.

Such crossing over of quadrature signals within a bandpass filter structure is also proposed in "A high-Q 200 MHz low-power fully-integrated bandpass IF filter", CICC'98.

Although those circuits enable filtering to be performed at a very high frequency, they do not enable the carrier frequency of the signal to be decreased (for a receiver) or increased (for a transmitter), even though four multipliers are used.

The object of the invention is to propose a method and apparatus for narrow filtering of a high frequency signal, also enabling the carrier frequency of the signal to-be reduced while making use of a small number of multipliers only.

This result is obtained with a bandpass filter method in which two frequency transpositions of an input signal for filtering are performed in parallel, making use respectively of a first mixing signal and of a second mixing signal which mixing signals are substantially in phase quadrature so as to obtain respective first and second transposed signals. The two transposed signals are filtered by two respective lowpass filters (with the transposition signals being at a frequency and with the lowpass filters having a passband that are associated respectively with the frequency of the input signal and with the passband desired for the bandpass filter). Thereafter, respective frequency transpositions are performed on the first and second filtered transposed signals using two respective output mixing signals, and the sum or the difference of the two signals obtained in this way is taken. These transpositions are characterized in that the output mixing signals are selected to be different in frequency from the first and second transposition signals so that the output signal lies in a desired frequency range.

To achieve this object, the invention also provides a bandpass filtering method in which two frequency transpositions are performed in parallel on an input signal for filtering using respective first and second upstream mixing signals that are substantially in phase quadrature so as to obtain respective first and second transposed signals, and the two transposed signals are filtered respectively by two lowpass filters, the frequency of the transposition signals and the passband of the low-pass filters being related to the frequency of the input signal and to the passband desired for the bandpass filter, then respective frequency transpositions are performed on the first and second filtered transposed signals using two respective downstream mixing signals, and the sum or the difference of the two signals obtained in this way is taken, the frequency of the output mixing signals is selected to be different from the frequency of the first and second mixing signals so that the output signal is transposed into a desired frequency range, the method being characterized in that a common oscillator is used which is coupled with a first phase shifter to produce the upstream mixing signals and which is coupled with a second phase shifter to produce the downstream mixing signals, and in that the phase shifters are used in opposite manner on the first and second signals so that each of said first and second signals receives the phase-advanced output signal from one of the two phase shifters and the phase-delayed output signal from the other of the two phase shifters.

Other characteristics, objects, and advantages of the invention will appear on reading the following detailed description given with reference to the accompanying drawings, in which.

Figure 1:
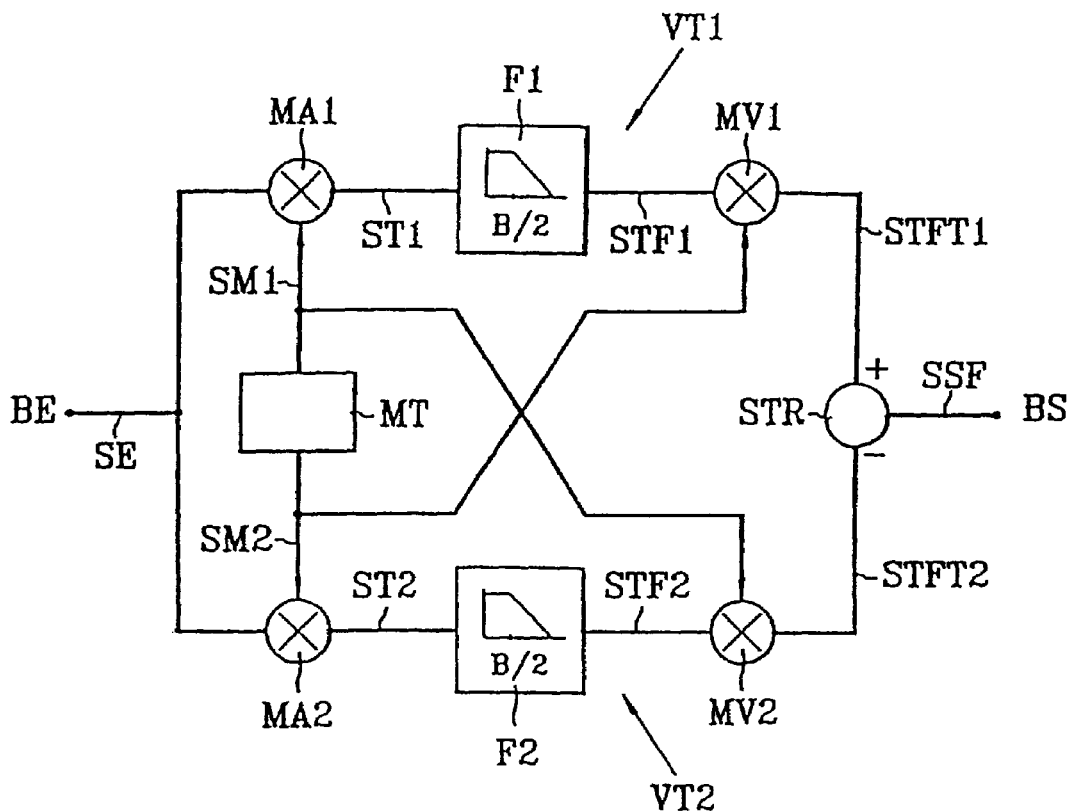
FIG. 1 shows the above-mentioned state-of-the-art circuit.
Figure 2:
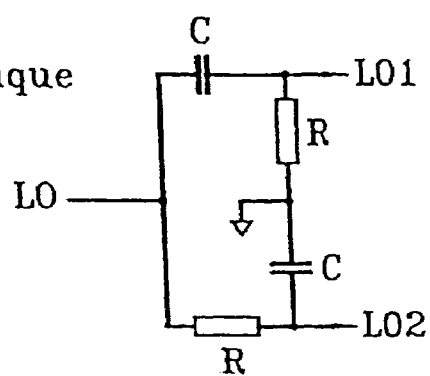
FIG. 2 shows the above-mentioned state-of-the-art RC-CR circuit.

As shown in FIG. 1, the prior art bandpass filter of bandwidth equal to B comprises an input terminal BE for receiving an input signal SE of angular frequency $\omega_e$, and two parallel processing paths VT1 and VT2. Each processing path has an upstream mixer MA1 (MA2) followed by a lowpass filter F1 (F2) connected to a downstream mixer MV1 (MV2). The respective outputs from the downstream mixers are connected to two inputs of a subtracter STR whose output is connected to the output terminal BS of the filter.

Transposition means MT are also provided, delivering two mixing signals SM1 and SM2 of angular frequency $\omega_0$, and substantially in phase quadrature. The first mixing signal SM1 is delivered to the upstream mixer MA1 and the resulting transposed signal ST1, after being filtered by the filter F1, gives a filtered transposed signal STF1 which, after being transposed in the downstream mixer MV1 using the second mixing signal SM2 delivers a retransposed signal STFT1 to one of the inputs of the subtracter STR.

Similarly, the second mixing signal SM2 is delivered to the upstream mixer MA2 so as to enable the transposed signal ST2 to be obtained and, after filtering, the filtered transposed signal STF2. This signal STF2, after being transposed in the downstream mixer MV2 using the first signal SM1, provides the retransposed signal STFT2 which is delivered to the other input of the subtracter STR.

After the difference has been taken between the two signals STFT1 and STFT2, the output signal SSF is stripped of the undesired sideband centered on angular frequency $2\omega_0 - \omega_e$, which is equivalent to eliminating the influence of the image signal from the input signal.

Figure 3:
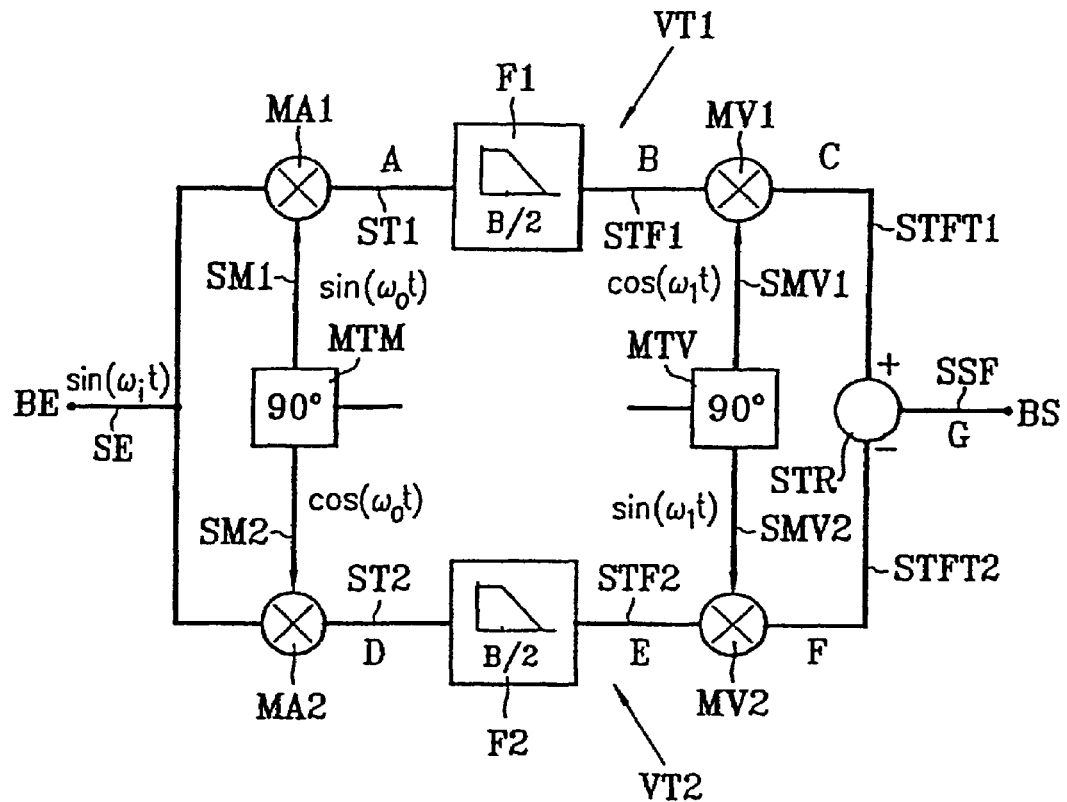
FIG. 3 is a schematic of a circuit of the invention.

As shown in FIG. 3, the bandpass filter of the invention reproduces the same general structure with two parallel processing paths VT1 and VT2, each having an upstream mixer MA1 (MA2) followed by a lowpass filter F1 (F2) connected to a downstream mixer MV1 (MV2).

The respective outputs from the downstream mixers are connected to the two inputs of a subtracter STR whose output is connected to the output terminal BS of the filter. In this circuit, likewise, the upstream mixers receive transposition signals in phase quadrature SM1 and SM2, and the two downstream mixers MV1 and MV2 likewise receive two transposition signals in phase quadrature.

Assuming, for simplification purposes, that the mixing signals delivered to the mixers MA1 and MA2 are respectively of the form $\sin(\omega_0 t)$ and $\cos(\omega_0 t)$, and that the angular frequency of the input signal SE is $\omega_i$, then the signals present at the outputs of these mixers present a first frequency band centered around angular frequency $(\omega_i - \omega_0)$, and a second frequency band centered around angular frequency $(\omega_i + \omega_0)$ which is eliminated by the lowpass filters F1 and F2.

The frequency $\omega_0$ and the bandwidth B/2 of the lowpass filters F1 and F2 are selected in such a manner that the following relationship is satisfied:

$$B > 2|\omega_0 - \omega_i|$$

In other words, $\omega_0$ is selected so as to achieve frequency transposition that matches the working frequency band which is to be filtered, with the upper limit B depending on the desired selectivity.

On output from the lowpass filters F1 and F2, the signals in the two branches are subjected to frequency transposition by multiplication with signals oscillating at angular frequency $\omega_1$.

The two transposition signals applied to the upstream mixers are at an angular frequency $\omega_0$ which is different from the angular frequency $\omega_1$ of the two transposition signals applied to the downstream mixers.

The signals obtained at the output from the downstream mixers in each of the two branches then present a first frequency band centered around the angular frequency $(-\omega_i + \omega_0 + \omega_1)$ and a second frequency band centered around the angular frequency $(\omega_i - \omega_0 + \omega_1)$.

The signals SMV1 and SMV2 injected respectively into the downstream mixers MV1 and MV2 are in phase quadrature, as are the signals SM1 and SM2 injected into the mixers MA1 and MA2, so one of the components of each signal reaching one of the two inputs of the subtracter STR cancels with the corresponding component of the signal reaching the other input of the subtracter. The remaining one of the two components in each signal adds with the remaining component in the other signal. Thus, a single frequency band is obtained at the output from the subtracter STR, and in this case the band centered on angular frequency $(\omega_i - \omega_0 + \omega_1)$.

By a suitable choice of $\omega_1$, it is possible to obtain a frequency band centered on a desired working frequency.

Figure 4:
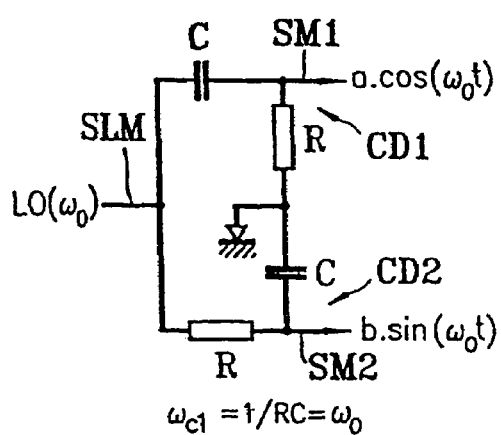
FIG. 4 is a schematic of an upstream phase shifter for the FIG. 3 circuit.

To deliver the quadrature signals SM1 and SM2 and the quadrature signals SMV1 and SMV2, the present embodiment proposes connecting the input of the upstream mixers to a unit comprising an oscillator LO at the frequency $\omega_0$ in association with an RC-CR type phase shifter MTM as shown in FIG. 4. This phase shifter MTM comprises two phase shifting cells CD1 and CD2 disposed respectively between the output of the local oscillator LO and each of the two processing paths VT1 and VT2.

The first phase shifting cell CD1 is a capacitive-resistive cell comprising a capacitor C having one terminal connected to an output of the oscillator LO and having its other terminal connected to ground via a resistor R. The other phase shifting cell CD2 is a resistive-capacitive cell comprising a same-resistance resistor R with one terminal connected to the output of the oscillator LO and its other terminal connected to ground via a capacitor C identical to that of the cell CD1.

After passing through the phase shifting cell CD1, the signal SL output by the local oscillator LO is subject to a phase shift of $90° - \theta$ (e.g. 45°) as defined by the product R×C so as to deliver the first mixing signal SM1. Since the resistance and capacitance R and C of the cell CD1 and of the cell CD2 are identical, the cell CD2 serves to deliver a second mixing signal SM2 of phase shift equal to $-\theta$ relative to the output signal from the oscillator LO.

The downstream phase shifter MTV receives an input sinewave signal at an angular frequency $\omega_1$. This input signal is generated by frequency division from the signal output at $\omega_0$ by the oscillator LO, using a conventional type of frequency divider.

In a variant, the two input signals for the phase shifters, respectively at $\omega_0$ and at $\omega_1$, can both be obtained by frequency division from a signal output by an oscillator, with the two division ratios naturally being different.

The ratio between the two frequencies $\omega_0$ and $\omega_1$ is known accurately, and is equal to a rational number, i.e. to a ratio of two integers.

Figure 5:
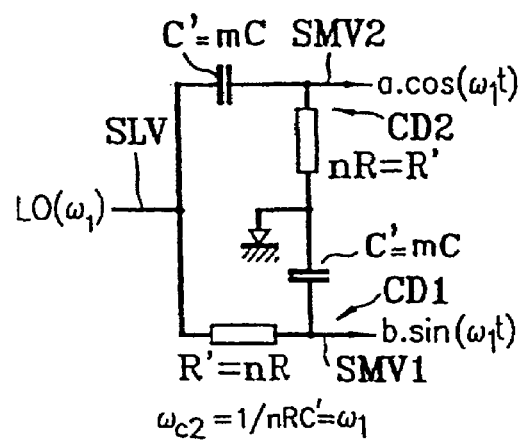
FIG. 5 is a schematic of a downstream phase shifter for the FIG. 3 circuit.

The downstream phase shifter MTV is similar in structure to the upstream phase shifter MTM, as can be seen in FIG. 5. For this second phase shifter, two capacitors C' are used, each having capacitance equal to mC where m is an integer. The two resistors R' of this phase shifter each has resistance equal to nR where n is an integer.

In a variant, the ratio m between C' and C can be a rational number, as can the ratio n between R' and R.

The resistances and the capacitances in the circuits MTM and MTV are selected so that the cutoff angular frequencies of each of these two circuits are equal to the angular frequencies of the signals they receive at their respective inputs, so as to obtain the same gain in both filtering paths VT1 and VT2 for both phase shifters.

The resistors and capacitors in the second phase shifter MTV thus have resistances and capacitances R' and C' selected so that the ratio R'C'/RC is equal to the ratio $\omega_0/\omega_1$ of the angular frequencies of the signals delivered to said two phase shifters MTM and MTV. The ratio $\omega_0/\omega_1$ is thus equal to a ratio of integers.

The phase shifters MTM and MTV are positioned in opposite manner so that each parallel branch VT1 and VT2 receives a phase-advanced signal on one of its phase shifters and a phase-delayed signal on its other phase shifter. In order to simplify, each of the phase shifters is assumed to deliver a sine signal and a cosine signal, with the disposition of the phase shifters being such that each branch VT1 or VT2 receives a sine signal on one of its phase shifters and a cosine signal on its other phase shifter. Each branch is connected to the R-C cell of one of the phase shifters and to the C-R cell of the other phase shifter.

Because the input signals to the phase shifters are supplied from a common oscillator LO, in the event of either of the two frequencies $\omega_0$ and $\omega_1$ being slightly offset, then the same offset will appear on the other one of said two frequencies, so both phase shifters will present an amplitude difference between their respective outputs that is the same. Since the phase shifters are oppositely positioned, each branch receives one amplified signal and one attenuated signal, such that any amplitude differences due to possible frequency variations of the oscillators is compensated within each branch and this compensation is effective over a wide frequency band.

Advantageously, $\omega_0$ and $\omega_1$ are selected in such a manner that the value of $\omega_0$ is equal to a rational number multiplied by the value of $\omega_1$. Thus, the desired ratio between the resistances in the two phase shifters and the desired ratio between the capacitances in the two phase shifters are rational numbers that can be obtained easily and accurately with techniques that are conventional in manufacturing integrated circuits. Furthermore, by using a ratio that is equal to a rational number for the cutoff frequencies, any difference in amplitude between sine and cosine is particularly similar in both phase shifters (ignoring errors in block matching, which will in any event be limited because of the integer ratio).

Provision is also made for these phase shifters to adopt a frequency ratio equal to an integer ratio and to adopt resistances and capacitances as a function of the integers constituting the ratio. C and C' can be selected to be equal and the resistances R' and R can be selected so that R'/R, i.e. $\omega_0/\omega_1$ is an integer number or a rational number. Similarly, R and R' can be selected to be equal and C and C' can be selected in such a manner that C'/C, i.e. $\omega_0/\omega_1$ is equal to an integer number or a rational number.

In addition, by making both phase shifters by using a similar succession of steps on each occasion, any difference in cutoff frequency or in phase shift value due to imperfection in manufacture will arrive in similar manner in both circuits, such that the difference will be compensated because these circuits are crossed-over.

The use of RC-CR type phase shifters nevertheless enables good phase accuracy to be obtained.

The invention thus makes it possible to facilitate complete integration of the analog portion of a receiver within an integrated circuit.

The invention claimed is:

1. A bandpass filter comprising:
   a first transposition circuit coupled to receive an input signal, wherein the first transposition circuit is configured to perform first and second signal transpositions using first and second mixing signals, respectively, in order to produce a first transposed signal, wherein the first and second mixing signals are of different frequencies, wherein the first transposition circuit includes a first upstream mixer coupled to receive the input signal and the first mixing signal and configured to perform the first signal transposition, a first low-pass filter configured to perform low-pass filtering of an output signal received from the first upstream mixer, and a first downstream mixer coupled to receive the second mixing signal and an output signal from the first low-pass filter and configured to perform the second signal transposition;
   a second transposition circuit coupled to receive the input signal, wherein the second transposition circuit is configured to perform third and fourth signal transpositions using third and fourth mixing signals, respectively, in order to produce a second transposed signal, wherein the third and fourth mixing signals are of the same frequencies as the first and second mixing signals, respectively, wherein the second transposition circuit includes a second upstream mixer coupled to receive the input signal and the third mixing signal and configured to perform the third signal transposition, a second low-pass filter configured to perform low-pass filtering of an output signal received from the second upstream mixer, and a second downstream mixer coupled to receive the fourth mixing signal and an output signal from the second low-pass filter and configured to perform the fourth signal transposition; and
   an output unit coupled to receive the first and second transposed signals, wherein the output unit is configured to produce a filtered output signal by taking one of a sum or a difference of the first and second output signals;
   wherein the bandpass filter has an upper limit B for a frequency band in which filtering is performed, wherein the upper limit is defined by a relationship $B > |\omega_0' - \omega_1'|$, wherein $\omega_0'$ is a frequency of the first and third mixing signals, and $\omega_1'$ is a frequency of the second and fourth mixing signals.

2. The bandpass filter as recited in claim 1, wherein the bandpass filter further includes:
   a first phase shifter coupled to provide the first mixing signal to the first upstream mixer and the third mixing signal to the second upstream mixer, wherein the first and third mixing signals are substantially in phase quadrature; and
   a second phase shifter coupled to provide the second mixing signal to the first downstream mixer and the fourth mixing signal to the second downstream mixer, wherein the second mixing signal and the fourth mixing signal are substantially in phase quadrature.

3. The bandpass filter as recited in claim 2, wherein the bandpass filter further includes:
   a local oscillator, wherein the local oscillator is configured to generate and provide a first local oscillator signal to the first phase shifter, wherein the first local oscillator signal is of the same frequency as the first and third mixing signals; and
   a divider coupled to receive the local oscillator signal and configured to divide the local oscillator signal in order to produce a second local oscillator signal of the same frequency as the second and fourth mixing signals, wherein the divider is coupled to provide the second local oscillator signal to the second phase shifter.

4. The bandpass filter as recited in claim 3, wherein a ratio n of the frequency of the first local oscillator signal to the frequency of the second local oscillator signal is an integer value.

5. The bandpass filter as recited in claim 4, wherein the first phase shifter includes a first resistor-capacitor (RC) circuit and a first capacitor-resistor (CR) circuit, wherein the second phase shifter includes a second RC circuit and a second CR circuit, wherein capacitance values of the capacitors in the first phase shifter are substantially equal to capacitor values in the second phase shifter, and wherein a ratio of resistor values of the first phase shifter to resistor values of the second phase shifter is the ratio n.

6. The bandpass filter as recited in claim 1, wherein the first and second low-pass filters each have a bandwidth of B/2.

7. The bandpass filter as recited in claim 2, wherein the first phase shifter has a cutoff frequency equal to the frequency of the first and third mixing signals, and wherein the second phase shifter has a cutoff frequency equal to the second and fourth mixing signals.

8. The bandpass filter as recited in claim 4, wherein the first phase shifter includes a first resistor-capacitor (RC) circuit and a first capacitor-resistor (CR) circuit, wherein the second phase shifter includes a second RC circuit and a second CR circuit, wherein resistor values of the first phase shifter circuit are substantially equal to resistor values of the second phase shifter circuit, and wherein a ratio of capacitance values of the capacitors in the first phase shifter to capacitor values in the second phase shifter is the ratio n.

9. A method for performing bandpass filtering, the method comprising:
  receiving an input signal in a first signal path;
  producing a first transposed signal by performing first and second signal transpositions in the first signal path using first and second mixing signals, respectively, wherein the first and second mixing signals are of different frequencies, wherein producing the first transposed signal includes performing the first signal transposition by transposing the input signal in a first upstream mixer coupled to receive the first mixing signal, filtering, in a first low-pass-filter an output signal received from the first upstream mixer, and performing the second signal transposition by transposing an output signal received from the first low-pass filter;
  receiving the input signal in a second signal path;
  producing a second transposed signal by performing third and fourth signal transpositions using third and fourth mixing signals, respectively, the third and fourth mixing signals having the same frequency as the first and second mixing signals, respectively, wherein producing the second transposed signal includes performing a third signal transposition by transposing the input signal in a second upstream mixer coupled to receive the third mixing signal, filtering, in a second low-pass filter, an output signal received from the second upstream mixer, and performing the fourth signal transposition by transposing an output signal received from the second low-pass filter; and
  producing a filtered output signal by taking one of a sum or a difference of the first and second transposed signals;
  wherein said bandpass filtering is performed in a frequency band having an upper limit B wherein the upper limit is defined by a relationship $B > |\omega_0 - \omega_1|$, wherein $\omega_0$ is a frequency of the first and third mixing signals and $\omega_1$ is a frequency of the second and fourth mixing signals.

10. The method as recited in claim 9, wherein the first and third mixing signals are provided, substantially in phase quadrature, to the first and second upstream mixers, respectively, and wherein the second and fourth mixing signals are provided, substantially in phase quadrature, to the first and second downstream mixers, respectively.

11. The method as recited in claim 10 further comprising:
  generating a first local oscillator signal having the frequency of the first and third mixing signals;
  providing the first local oscillator signal to a first phase shifter, the first phase shifter being configured to generate the first and third mixing signals based on the first local oscillator signal;
  generating a second local oscillator signal by dividing the first local oscillator signal, the second local oscillator signal having the frequency of the second and fourth mixing signals; and
  providing the second local oscillator to a second phase shifter, the second phase shifter being configured to generate the second and fourth mixing signals based on the second local oscillator signal.

12. The method as recited in claim 11, wherein a ratio n of the frequency of the first local oscillator signal to the frequency of the second local oscillator signal is an integer value.

13. The method as recited in claim 12, wherein the first phase shifter includes a first resistor-capacitor (RC) circuit and a first capacitor-resistor (CR) circuit, wherein the second phase shifter includes a second RC circuit and a second CR circuit, wherein capacitance values of the capacitors in the first phase shifter are substantially equal to capacitor values in the second phase shifter, and wherein a ratio of resistor values of the first phase shifter to resistor values of the second phase shifter is the ratio n.

14. The method as recited in claim 9, wherein said low-pass filtering is performed in a bandwidth B/2.

15. The method as recited in claim 11, wherein the first phase shifter has a cutoff frequency equal to the frequency of the first and third mixing signals, and wherein the second phase shifter has a cutoff frequency equal to the second and fourth mixing signals.

16. The method as recited in claim 12, wherein the first phase shifter includes a first resistor-capacitor (RC) circuit and a first capacitor-resistor (CR) circuit, wherein the second phase shifter includes a second RC circuit and a second CR circuit, wherein resistor values of the first phase shifter circuit are substantially equal to resistor values of the second phase shifter circuit, and wherein a ratio of capacitance values of the capacitors in the first phase shifter to capacitor values in the second phase shifter is the ratio n.

17. A communications device comprising:
  a GSM (Global System for Mobile Communication) terminal, wherein the GSM terminal includes one or more bandpass filters configured to perform filtering of an input signal, wherein each of the one or more bandpass filters includes:
    a first transposition circuit coupled to receive the input signal, wherein the first transposition circuit is configured to perform first and second signal transpositions using first and second mixing signals, respectively, in order to produce a first transposed signal, wherein the first and second mixing signals are of different frequencies;
    a second transposition circuit coupled to receive the input signal, wherein the second transposition circuit is configured to perform third and fourth signal transpositions using third and fourth mixing signals, respectively, in order to produce a second transposed signal, wherein the third and fourth mixing signals are of the same frequencies as the first and second mixing signals, respectively; and
    an output unit coupled to receive the first and second transposed signals, wherein the output unit is configured to produce a filtered output signal by taking one of a sum or a difference of the first and second output signals, wherein each of the one or more bandpass filters has an upper limit B for a frequency band in which filtering is performed, wherein the upper limit is defined by a relationship $B > |\omega_0 - \omega_1|$, wherein $\omega_0$ is a frequency of the first and third mixing signals, and $\omega_1$ is a frequency of the second and fourth mixing signals.

18. The communications device as recited in claim 17, wherein one of the one or more bandpass filters is implemented in a transmitter portion of the GSM terminal.

19. The communications device as recited in claim 18, wherein one of the one or more bandpass filters is implemented in a receiver portion of the GSM terminal.

20. The communications device as recited in claim 18, wherein the GSM terminal includes an analog portion implemented within an integrated circuit, wherein the analog portion includes the one or more bandpass filters.

21. An integrated circuit comprising:
an analog portion of a receiver including at least one bandpass filter, the at least one bandpass filter including:
a first transposition circuit coupled to receive an input signal, wherein the first transposition circuit is configured to perform first and second signal transpositions using first and second mixing signals, respectively, in order to produce a first transposed signal, wherein the first and second mixing signals are of different frequencies;
a second transposition circuit coupled to receive the input signal, wherein the second transposition circuit is configured to perform third and fourth signal transpositions using third and fourth mixing signals, respectively, in order to produce a second transposed signal, wherein the third and fourth mixing signals are of the same frequencies as the first and second mixing signals, respectively; and
an output unit coupled to receive the first and second transposed signals, wherein the output unit is configured to produce a filtered output signal by taking one of a sum or a difference of the first and second output signals;
wherein the at least one or more bandpass filters has an upper limit B for a frequency band in which filtering is performed, wherein the upper limit is defined by a relationship $B > |\omega_0 - \omega_1|$, wherein $\omega_0$ is a frequency of the first and third mixing signals, and $\omega_1$ is a frequency of the second and fourth mixing signals.

* * * * *